United States Patent
Chen et al.

(10) Patent No.: US 8,599,997 B2
(45) Date of Patent: Dec. 3, 2013

(54) MULTIPLE-MODULUS DIVIDER AND ASSOCIATED CONTROL METHOD

(75) Inventors: Yen-Tso Chen, Hsinchu (TW); Jian-Yu Ding, Hsinchu (TW)

(73) Assignee: MStar Semiconductor, Inc., Hsinchu (TW)

( * ) Notice: Subject to any disclaimer, the term of this patent is extended or adjusted under 35 U.S.C. 154(b) by 0 days.

(21) Appl. No.: 13/556,392

(22) Filed: Jul. 24, 2012

(65) Prior Publication Data
US 2013/0027111 A1    Jan. 31, 2013

(30) Foreign Application Priority Data
Jul. 29, 2011    (TW) .................................. 100127102

(51) Int. Cl.
*H03K 21/00*    (2006.01)
*H03K 23/00*    (2006.01)

(52) U.S. Cl.
USPC .............................................. 377/47; 377/48

(58) Field of Classification Search
None
See application file for complete search history.

(56) References Cited

U.S. PATENT DOCUMENTS

| 7,298,810 B2 * | 11/2007 | Ke .................................... 377/48 |
| 7,564,276 B2 * | 7/2009 | Narathong et al. ........... 327/117 |
| 7,587,019 B2 * | 9/2009 | Yu et al. .......................... 377/47 |
| 2007/0160179 A1 * | 7/2007 | Narathong et al. ............. 377/47 |
| 2009/0213980 A1 * | 8/2009 | Ding et al. ....................... 377/48 |
| 2012/0194220 A1 * | 8/2012 | Cavin ............................ 326/104 |
| 2013/0082748 A1 * | 4/2013 | Karalar ......................... 327/115 |

* cited by examiner

*Primary Examiner* — Tuan T Lam
(74) *Attorney, Agent, or Firm* — WPAT, PC; Justin King

(57) ABSTRACT

A multiple-modulus divider and an associated control method are provided. The multiple-modulus divider includes a divisor loader, a multiple-modulus dividing circuit and a modulus controller. The divisor loader downloads a divisor when a download signal indicates a start of a division period. The multiple-modulus circuit includes a plurality of cascaded divisors, and provides an output frequency according to an input frequency and the divisor. The dividers respectively output a plurality of modulus output signals, and each is operable under either a close-loop state or an open-loop state. The modulus controller selects and controls one of the dividers according to the divisor, and ensures the selected divider is maintained at the open-loop state when the division period ends. The download signal corresponds to one of the modulus output signals.

13 Claims, 8 Drawing Sheets

MULTIPLE-MODULUS DIVIDER AND ASSOCIATED CONTROL METHOD

FIELD OF THE INVENTION

The present invention relates to a frequency synthesizer, and more particularly to a multiple-modulus divider in a frequency synthesizer.

BACKGROUND OF THE INVENTION

A frequency synthesizer, being a crucial constituent in a wireless communication system, is responsible for handling conversion between high frequency carrier waves and baseband signals. Therefore, a quality of signal conversion and overall performance of a transmission system are greatly dependent on a design quality of a frequency synthesizer. In a radio frequency (RF) wireless transmission system, a frequency synthesizer is generally realized by a phase-locked loop (PLL), which is currently dominated by sigma-delta ($\Sigma$-$\Delta$) modulation fractional PLL structure; sigma-delta ($\Sigma$-$\Delta$) modulation is a method for encoding analog signals into digital signals or higher-resolution digital signals into lower-resolution digital signals using error feedback, where the difference between the two signals is measured and used to improve the conversion. In such a structure, a fractional frequency dividing circuit is formed by integrating a multiple-modulus divider with a $\Sigma$-$\Delta$ modulator.

FIG. 1 shows a schematic diagram of a multiple-modulus divider 10 disclosed in a publication "IEEE, J. Solid-State Circuit" by S. Vaucher. The multiple-modulus divider 10 comprises eight dividers $CE_0$ to $CE_7$. A divisor is consisted of control signals $P_0$ to $P_7$. FIG. 2 shows an arbitrary divider $CE_n$ in FIG. 1, where n is an integer from 0 to 7. The divider $CE_n$ divides an input frequency at a frequency input end $F_I$ by 2 or 3 to generate an output frequency at a frequency output end $F_O$. A state of the divider $CE_n$ dividing by 2 or 3 is controlled by a control signal $P_n$ at a control end $P_I$ and a modulus input signal $MI_n$ at a modulus input end $M_I$. The multiple-modulus divider 10 in FIG. 1 performs frequency dividing according to a divisor on an input frequency at the frequency input end $F_I$ of the dividers $CE_0$, so as to output a result at the modulus output end $M_O$ of the divider $CE_0$. The multiple-modulus divider 10 is operable within a divisor range of $2^8$ to $2^{8+1}-1$.

In order to extend the operable divisor range in a way that a multiple-modulus divider adopting a single input frequency is able to accommodate frequency ranges of various application protocols, a divisor extension logic 12 is added as shown in FIG. 3 to form a multiple-modulus divider 14 that has an extended operable divisor range of $2^5$ to $2^{8+1}-1$. In FIG. 3, the divisor is consisted of control signals $P_0$ to $P_8$, one control signal for each respective divider. A number sequence [$P_8$, $P_7$, ..., $P_0$] is utilized as a divisor control P to represent logic values of the control signals $P_0$ to $P_8$. Briefly speaking, the divisor extension logic 12 selectively bypasses last several divisors according to a current divisor, such that frequency dividing is not provided for an input frequency $F_{IN}$ in equivalence. For example, for a divisor 63, the divisor control P is [000111111]. Since the control signals $P_6$ to $P_8$ are 0, a modulus input signal $MI_4$ is fixed to 1, which means the dividers $CE_5$ to $CE_7$ are to be skipped, providing no frequency dividing effects during frequency generation. At this point, frequencies of modulus output signals $MO_0$ to $MO_4$ are the same, being approximately ⅓ of a signal frequency at the frequency input end $F_I$ of the dividers $CE_0$.

SUMMARY OF THE INVENTION

According to an aspect of the present invention, a multiple-modulus divider comprising a divisor loader, a multiple-modulus dividing circuit, and a modulus controller is provided. The divisor loader downloads a divisor when a download signal indicates a start of a division period. The multiple-modulus dividing circuit comprises a plurality of cascaded dividers, and provides an output frequency according to an input frequency and the divisor. The dividers respectively output a plurality of modulus output signals, and each is operable under either a close-loop state or an open-loop state. The modulus controller selectively controls one of the dividers according to the divisor, and ensures the selected divider is maintained at the open-loop state when the division period ends. The download signal corresponds to one of the modulus output signals.

According to another aspect of the present invention, a control method for a multiple-modulus dividing circuit is provided. The multiple-modulus dividing circuit comprises a plurality of cascaded dividers, and outputs an output frequency according to an input frequency and the divisor. Each of the dividers is operable under either a close-loop state or an open-loop state. The method comprises: providing a download signal, the download signal defining a division period; loading a divisor at a start of the division period; selecting one of the dividers as a selected divider according to the divisor; and controlling the selected divider in the division period and after a switching edge of the download signal, so as to ensure the selected divider to operate under the open-loop state within the division period.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

To realize a fractional frequency dividing circuit, a divisor of the multiple-modulus divider may switch between two or more integers. For example, for a desired fractional divisor 63.5, a possible divisor number sequence is (63, 64, 63, 64, . . . ). A multiple-modulus divider is required to precisely execute the desired dividing effects during the divisor switching process, or else an entire PLL may fail to converge in the event of an erroneous output frequency.

Figure 3:
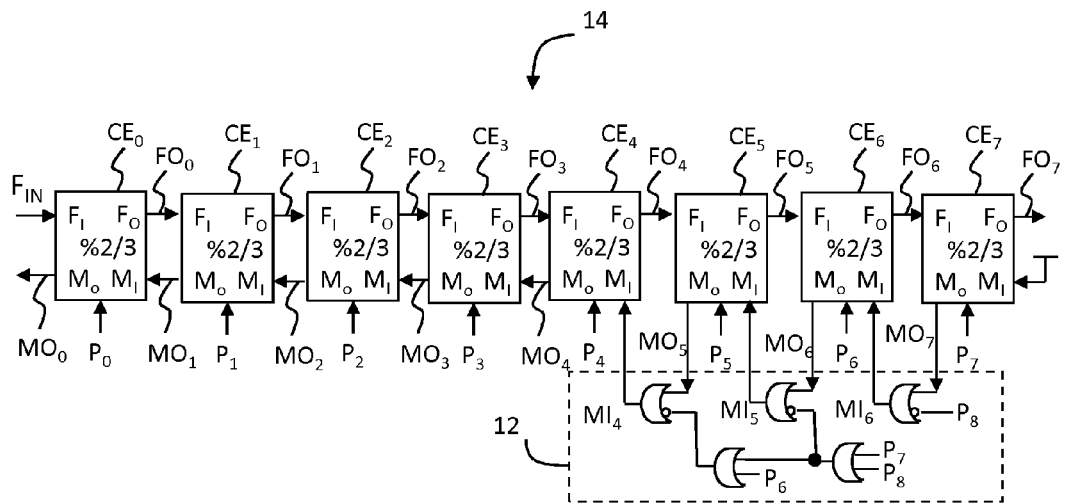
FIG. 3 is a multiple-modulus divider comprising an additional divisor extension logic.
Figure 4:
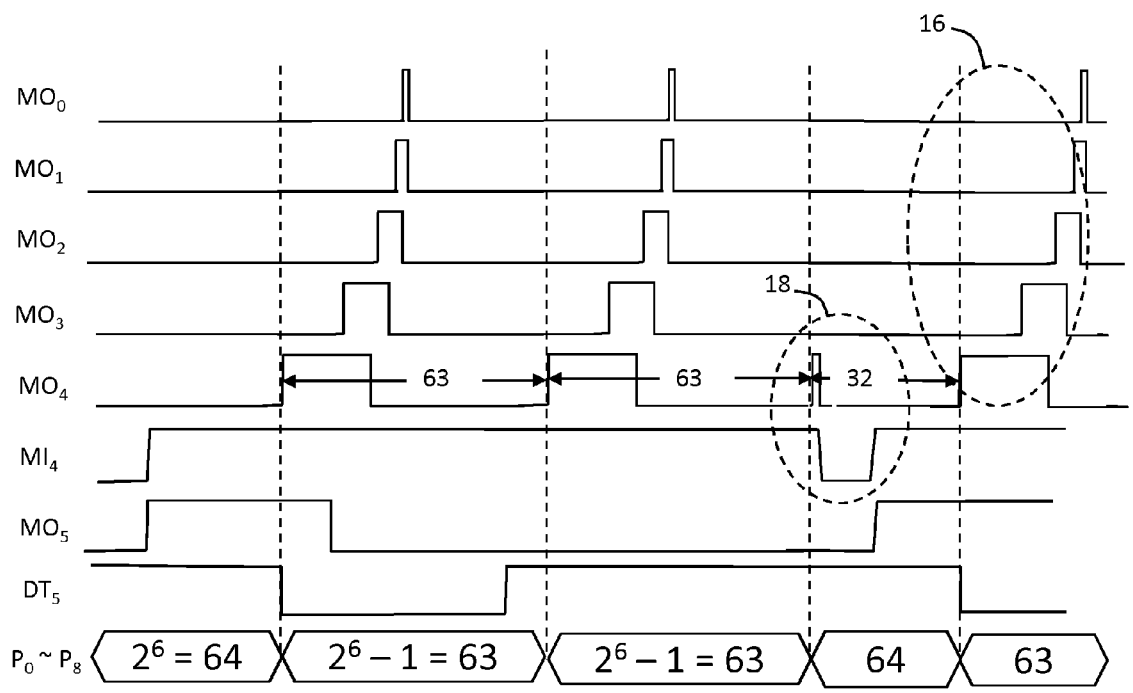
FIG. 4 is a timing diagram of signals associated with FIG. 3.

The multiple-modulus divider 14 in FIG. 3 outputs erroneous frequencies for certain predetermined divisor sequences. FIG. 4 shows a timing diagram of signals associated with FIG. 3, wherein a signal $DT_5$ having a divisor sequence (64, 63, 63, 64, 63) is a signal at a DT end in the divisor $CE_5$. As shown in a region 18 in FIG. 4, a pulse of the modulus output signal $MO_4$ is too short to be transmitted, such that a modulus output signal $MO_3$ is generated and an output result of the period being divided by 63 is lost.

Figure 1:
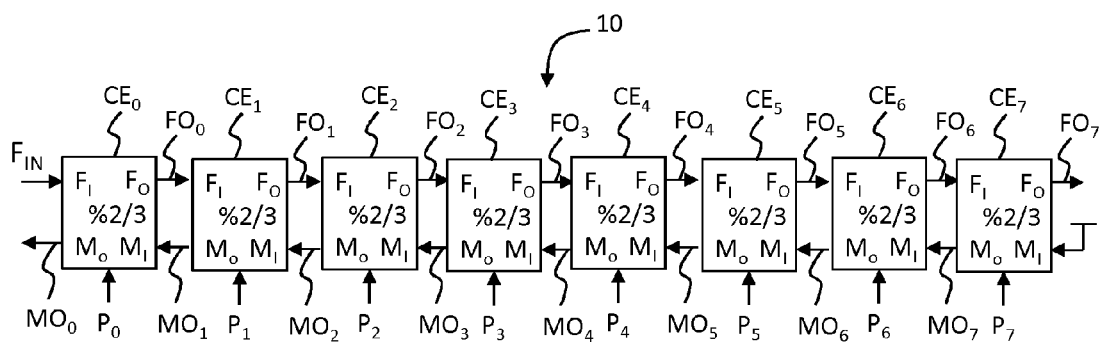
FIG. 1 is a schematic diagram of a multiple-modulus divider in a prior publication.
Figure 2:
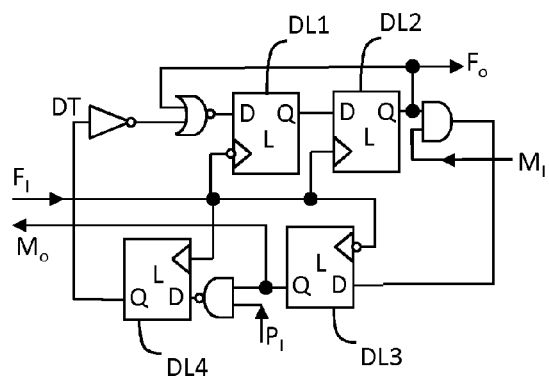
FIG. 2 is a schematic diagram of a divider in FIG. 1.

One of the main reasons causing the erroneous frequency is an operation difference of the divider $CE_5$. When the divisor is 63, the divisor control P in FIG. 3 is [000111111]. Although the divider $CE_5$ should skip at this point, it still divides the frequency output signal $FO_4$ by 3 to generate the modulus output signal $MO_5$, since the control signal $P_5$ is 1, and modulus input signal $MI_5$ is 1. Again referring to FIG. 2, D latches DL1 and DL2 in a divider and a link between the two forms a divided-by-2 loop, and a signal at the end point DT determines whether the divided-by-2 loop is closed or open. To perform frequency dividing by 3, the divided-by-2 loop shall first be open for a period of time and then become closed. Therefore, when the divider $CE_5$ is divided by a divisor 63, the divided-by-2 loop may be either closed or open. When the divisor is switched from 63 to 64, different results may be rendered when the divider $CE_5$ operates at different loop states to lead to erroneous frequencies. As shown in FIG. 4, towards the end of the first divided-by-63 period, the signal $DT_5$ goes into transition and the open divided-by-2 loop in the divider $CE_5$ becomes closed. In the second divided-by-63 division period, the signal $DT_5$ is stabilized to close the divided-by-2 loop. As observed from FIG. 4, the modulus output signals $MO_0$ to $MO_4$ prematurely appear in the region 16, and so the frequency of the modulus output signal $MO_0$ is not a desired result of being divided by 64. Further, the modulus output signal $MO_4$ is also seemingly a result from erroneously dividing by 32.

Figure 5:
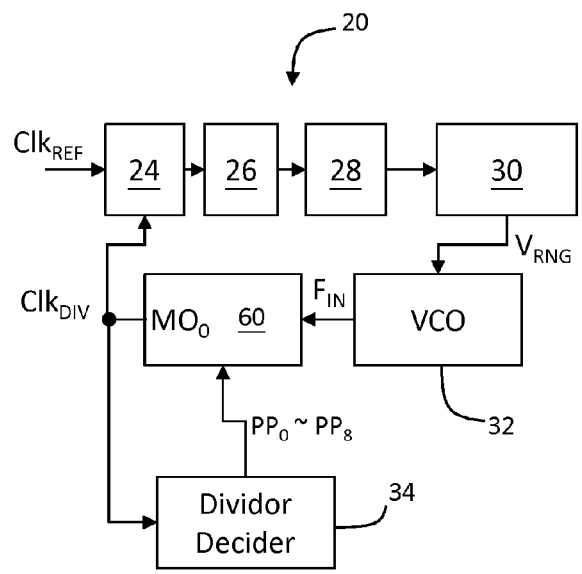
FIG. 5 is a schematic diagram of a PLL structure according to an embodiment of the present invention.

FIG. 5 shows a schematic diagram of a PLL 20 comprising a phase detector 24, a charge pump 26, a loop filter 28, a voltage buffer 30, a voltage-controlled oscillator (VCO) 32, a multiple-modulus divider 60, and a modulus decider 34 according to an embodiment of the present invention. The multiple-modulus divider 60 utilizes a modulus output signal $MO_0$ as a clock $CLK_{DIV}$ after frequency dividing and provides the clock $CLK_{DIV}$ to the phase detector 24 and a divisor decider 34. For example, the divisor decider 34 comprises a Σ-Δ modulator, which outputs control signals $PP_0$ to $PP_8$ to the multiple-modulus divider 60 to determine a divisor to be instantly provided to the multiple-modulus divisor 60.

Figure 6:
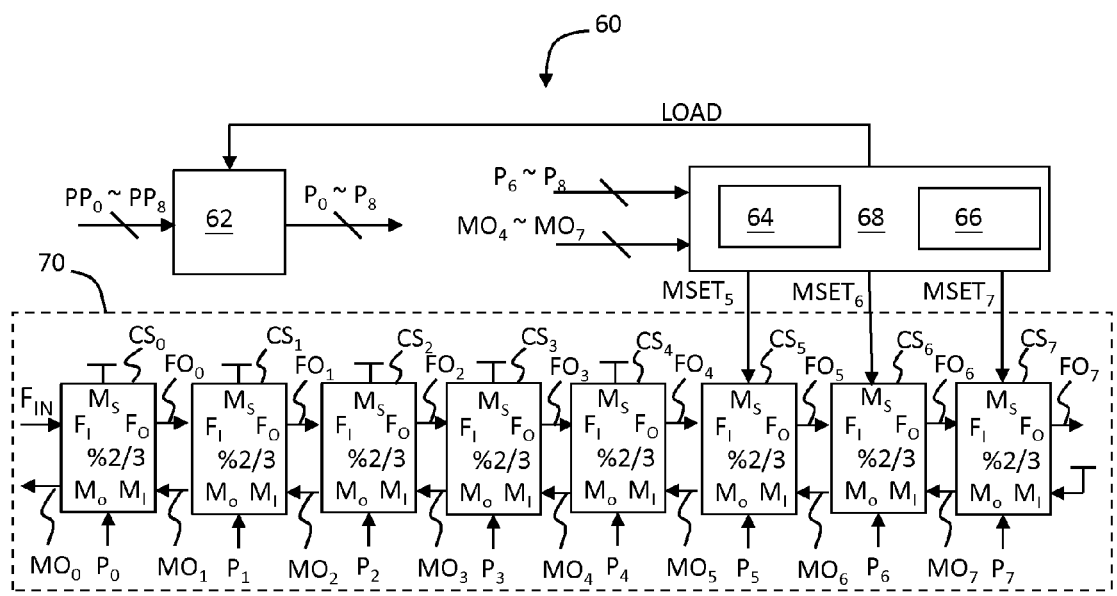
FIG. 6 is a schematic diagram of a multiple-modulus divider in FIG. 5.

FIG. 6 shows a schematic diagram of the multiple-modulus divider 60 in FIG. 5. The multiple-modulus divider 60 comprises a divisor loader 62, a modulus controller 68, and a multiple-modulus dividing circuit 70. The divisor loader 62 downloads the control signals $PP_0$ to $PP_8$ outputted by the divisor decider 34 as control signals $P_0$ to $P_8$ to be utilized by the modulus controller 68 and the multiple-modulus dividing circuit 70. The modulus controller 68 generates a download signal LOAD and setting signals $MSET_5$ to $MSET_7$ according to the control signals $P_0$ to $P_8$, and performs frequency dividing to generate the modulus output signal $MO_0$. The multiple-modulus dividing circuit 70 comprises eight cascaded dividers $CS_0$ to $CS_7$.

Figure 7:
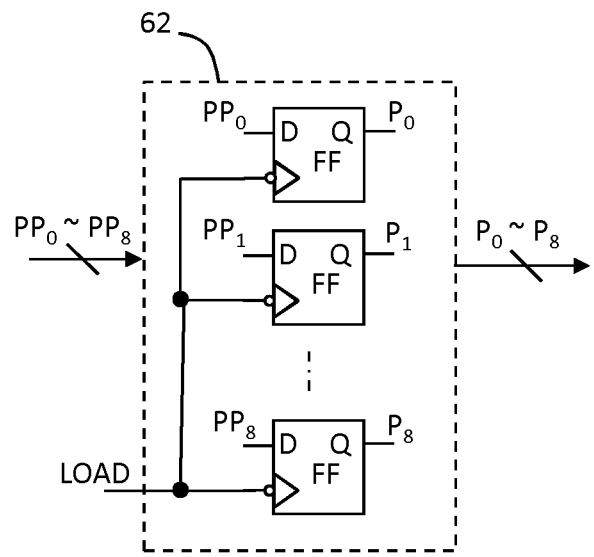
FIG. 7 is a schematic diagram of divisor loader in FIG. 6.

FIG. 7 shows a schematic diagram of the divisor loader 62 in FIG. 6. The divisor loader 62 comprises nine D flip-flops, which download the controls signals $PP_0$ to $PP_8$ at a falling edge of the download signal LOAD to serve as the control signals $P_0$ to $P_8$. More specifically, the falling edge of the download signal LOAD, as an indication of a start of a division period and an end of a previous division period, downloads a divisor determined by the divisor decider 34 and provides the divisor to the multiple-modulus divider 60.

Figure 8:
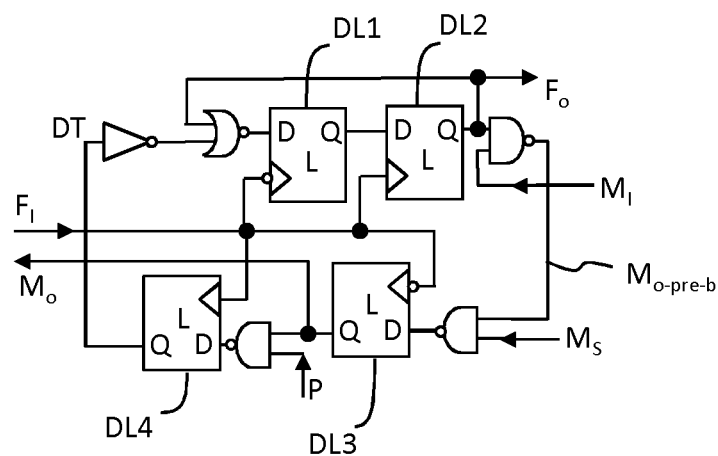
FIG. 8 is a schematic diagram of divider in FIG. 6.

FIG. 8 shows a divider $CS_n$, where n is an integer from 0 to 7. When a setting end $M_S$ is 1, operations and functions of the divider $CS_n$ are identical to those of the divider $CE_n$ in FIG. 2. Therefore, each of the dividers $CS_0$ to $CS_4$ may be replaced by the divider shown in FIG. 2 to achieve the same effects. When a signal $DT_n$ at the end point DT is 1, a divided-by-2 loop formed by D latches DL1 and DL2 is closed so that the divider $CS_n$ operates under a closed state. In contrast, when the signal $DT_n$ at the end point DT is 0, the divider $CS_n$ operates under an open state. When the setting end $M_S$ is 0, a D input of a D latch DL3 forces the modulus output signal $MO_n$ outputted by the modulus output end $M_o$ to 1 after a period of time. Supposing P is 1 at this point, the signal $DT_n$ at the end point DT is forced to 0 after another period of time to force the divider $CS_n$ to operate under an open state.

Figure 9A:
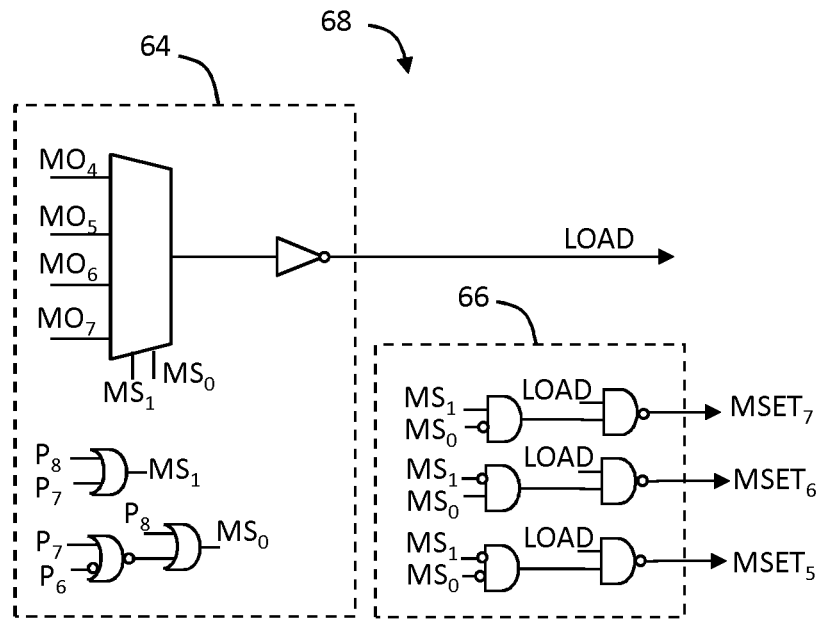
FIG. 9A and FIG. 9B are schematic diagram of two modulus controllers.

FIG. 9A shows a schematic diagram of the modulus controller 68 comprising two devices, i.e., a download signal selector 64 and a modulus setting selector 66. The download signal selector 64 selects one of the modulus output signals $MO_4$ to $MO_7$, and reverses the selected signal to serve as the download signal. In other words, the download signal is generated from one of the modulus output signals. The modulus setting selector 66 selectively controls one of the setting ends $M_S$ in the dividers $CS_5$ to $CS_7$ to enable the controlled setting end $M_S$ to receive the download signal LOAD.

Selection rules associated with FIG. 9A are to be described below. From a current divisor, i.e., the divisor control P, it is known that first k+1 dividers $CS_0$ to $CS_k$ are required for frequency dividing, which means that the dividers $CS_{k+1}$ to $CS_7$ need to be skipped. At this point, a modulus output signal $MO_k$ of a last divider of the required dividers, i.e., the modulus output signal $MO_k$ of the last divider $CS_k$, is selected to generate the download signal LOAD. The setting end $M_S$ of a first skipped dividers, i.e., the setting end $M_S$ of the divider $CS_{k+1}$, then receives the download signal LOAD. For example, when $[P_6, P_7, P_8]$ equals [0, 0, 0] (with a divisor range being 32 to 63), the last divider for providing frequency dividing is the divider $CS_4$ and the first skipped divider is the divider $CS_5$. At this point, the reverse of the modulus output signal $MO_4$ in FIG. 9A is the download signal LOAD. Similarly, when the divisor range is 64 to 127 (i.e., $[P_6, P_7, P_8]$ equals [1, 0, 0]), the reverse of the modulus output signal $MO_5$ is the download signal LOAD, wherein the modulus output signal $MO_5$ is received by the setting end $M_S$ of the divider $CS_6$. Further, the reverse of the modulus output signal $MO_6$ is the download signal LOAD when the divisor range is 128 to 255 (i.e., $[P_6, P_7, P_8]$ equals [X, 1, 0]), wherein the modulus output signal $MO_6$ is received by the setting end $M_S$ of the divider $CS_7$, and so forth.

Figure 10:
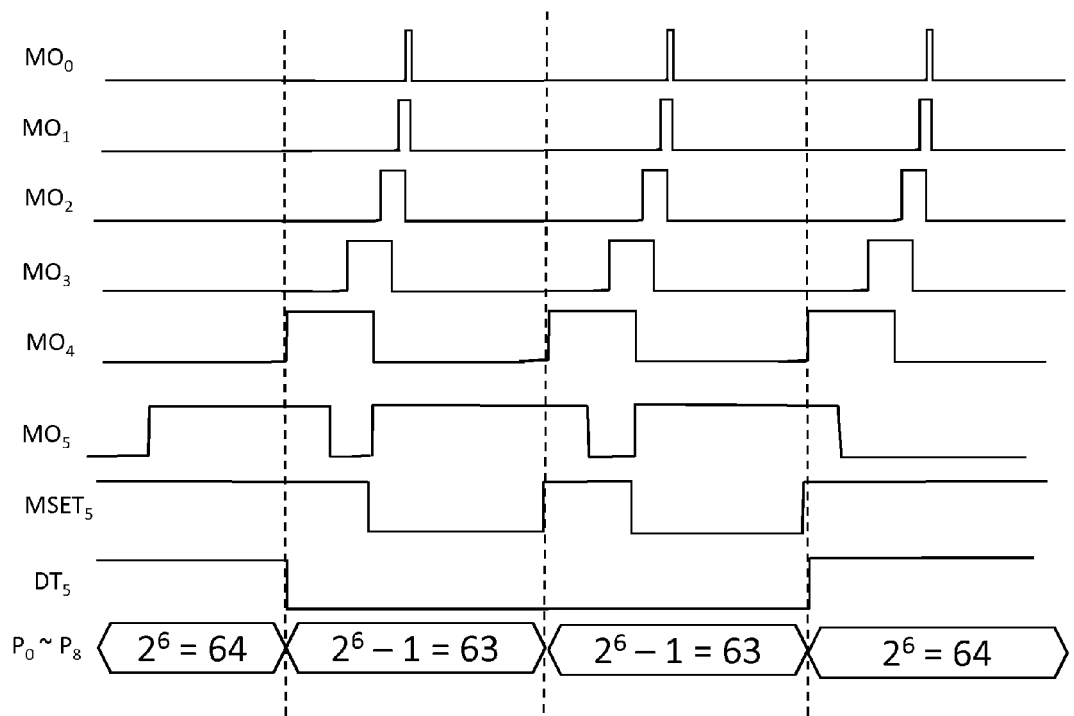
FIG. 10 is a timing diagram of signals associated with FIG. 6.

FIG. 10 shows a timing diagram of signals associated with FIG. 6, with a divisor sequence (64, 63, 63, 64) also indicated. A rising edge of the modulus output signal $MO_4$ defines a start of a divisor period, and so a divisor at that point is downloaded. In the division period with a divisor of 63, the setting signal $MSET_5$ at the setting end $M_S$ of the divider $CS_5$ is in equivalence the modulus output signal $MO_4$. It is also observed from FIG. 10 that, in the division period with a divisor of 63, the divider $CS_5$ is maintained to operate at an open-loop state when the signal $DT_5$ is kept at 0. In addition, due to the fact that the divider $CS_5$ operates under an open-loop state when the division period with a divisor of 63 ends, the execution of frequency dividing by a divisor of 64 is ensured when entering a division period with a divisor of 64. Compared to FIG. 4, it is also discovered that desired frequency dividing operations are accurately performed in all corresponding division periods in FIG. 10.

Further, it is also observed from FIG. 10 that, during the division period with a divisor of 63, the modulus output signal $MO_5$, although being potentially logic 0, is quickly controlled by the falling edge of the modulus output signal $MO_4$ to restore to logic 1. That is to say, the performance accuracy of the divisor 63 is left unaffected.

Figure 9B:
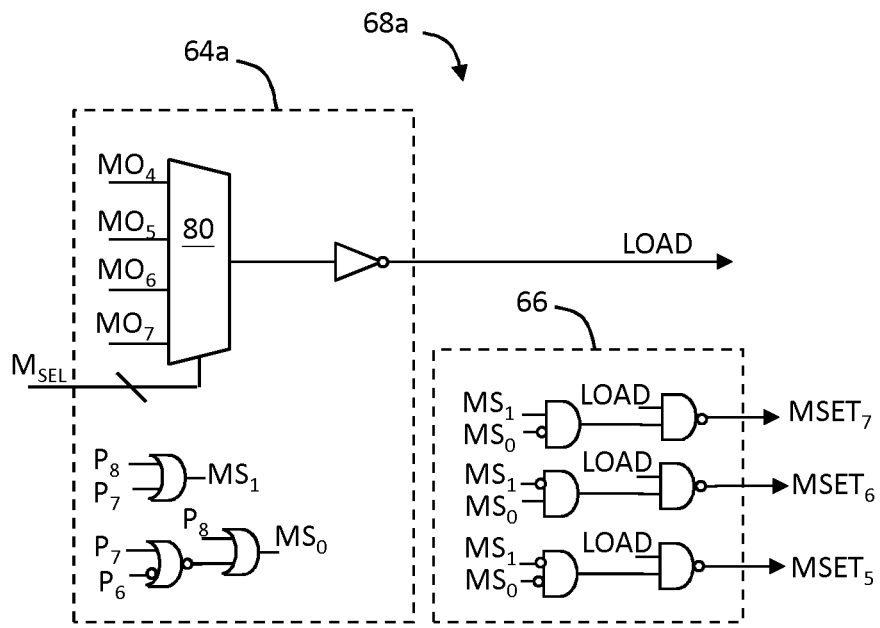

FIG. 9B shows a schematic diagram of another modulus controller 68a. Being different from FIG. 9A, a control end of a multiplexer 80 is for receiving another selection signal $M_{SEL}$ instead of the selection signals $MS_1$ and $MS_2$. For example, the selection signal $M_{SEL}$ is directly generated by the divisor decider 34 in FIG. 5.

Figure 11A:
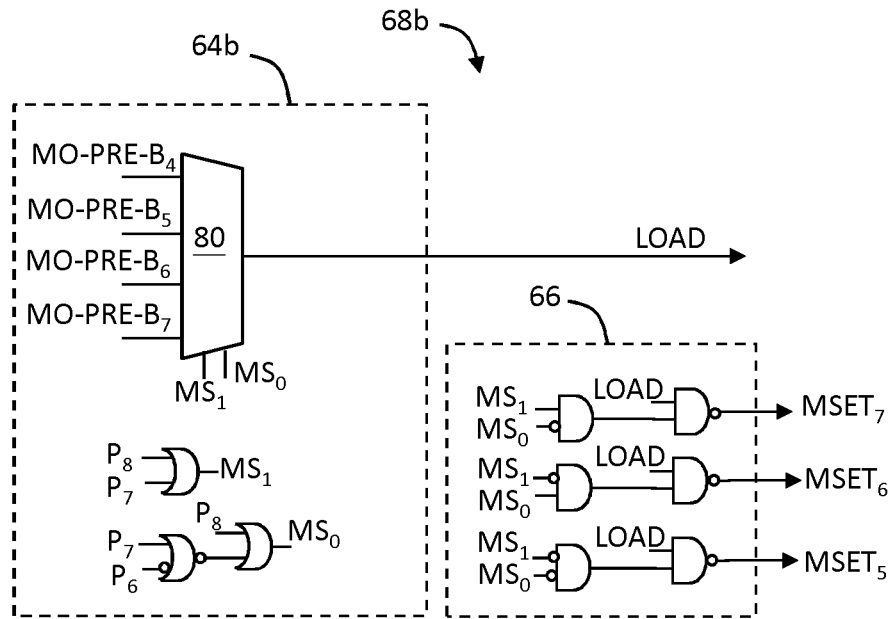
FIG. 11A and FIG. 11B are schematic diagram of another two modulus controllers.
Figure 12:
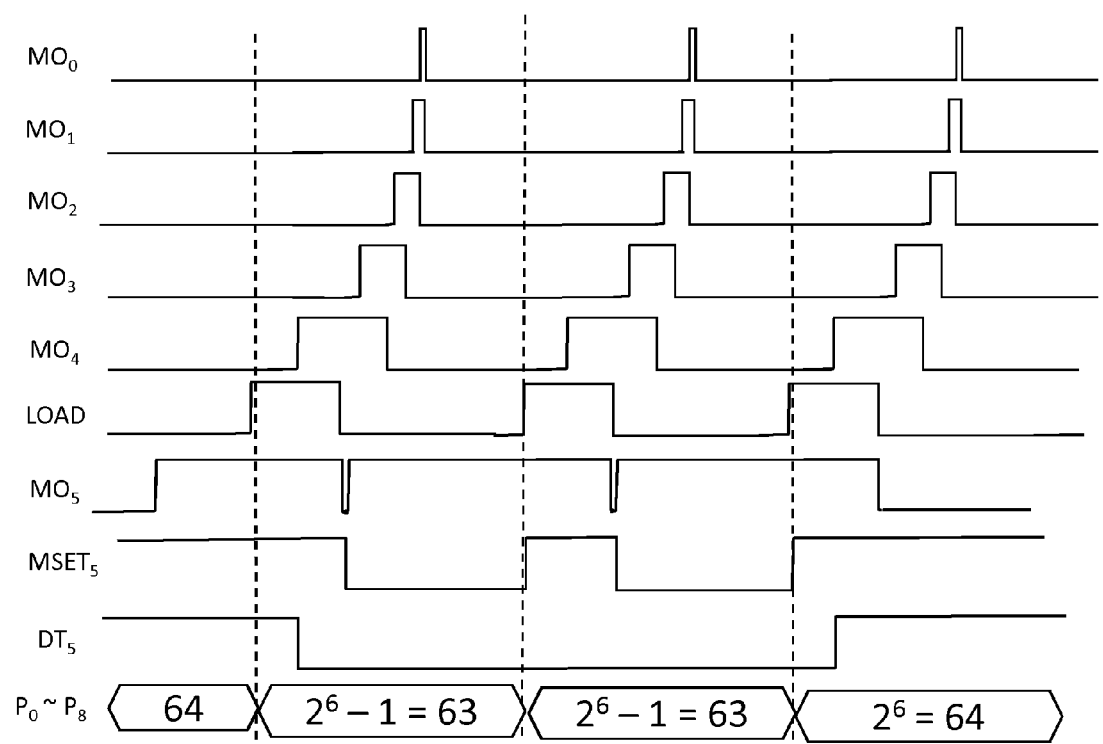
FIG. 12 is a timing diagram of associated signals when the modulus controller in FIG. 6 is replaced by the modulus controller in FIG. 11A.

FIG. 11A shows a schematic diagram of another modulus controller 68b. Being different from FIG. 9A, a control end of a multiplexer 80 in FIG. 11A is for receiving signals MO-PRE-$B_4$ to MO-PRE-$B_7$ instead of the modulus output signals $MO_4$ to $MO_7$. The signal MO-PRE-$B_n$ in the divider $CS_n$ is a signal at an end $M_{o\text{-}pre\text{-}b}$ (e.g., FIG. 8). In FIG. 11A, the multiplexer 80 directly outputs the download signal LOAD. FIG. 12 shows a timing diagram of signals when the modulus controller 68 in FIG. 6 is replaced by the modulus controller 68b. As shown in FIG. 12, a division period is determined by the signal MO-PRE-$B_4$. At a falling edge of the signal MO-PRE-$B_4$, i.e., a rising edge of the download signal LOAD, a corresponding divisor is downloaded to serve as a divisor at that point. During a division period with a divisor of 63, the setting signal $MSET_5$ is the reverse of the signal MO-PRE-$B_4$. As shown in FIG. 12, in both division periods with a divisor of 63 and division periods with a divisor of 64, frequency dividing is accurately performed.

Figure 11B:
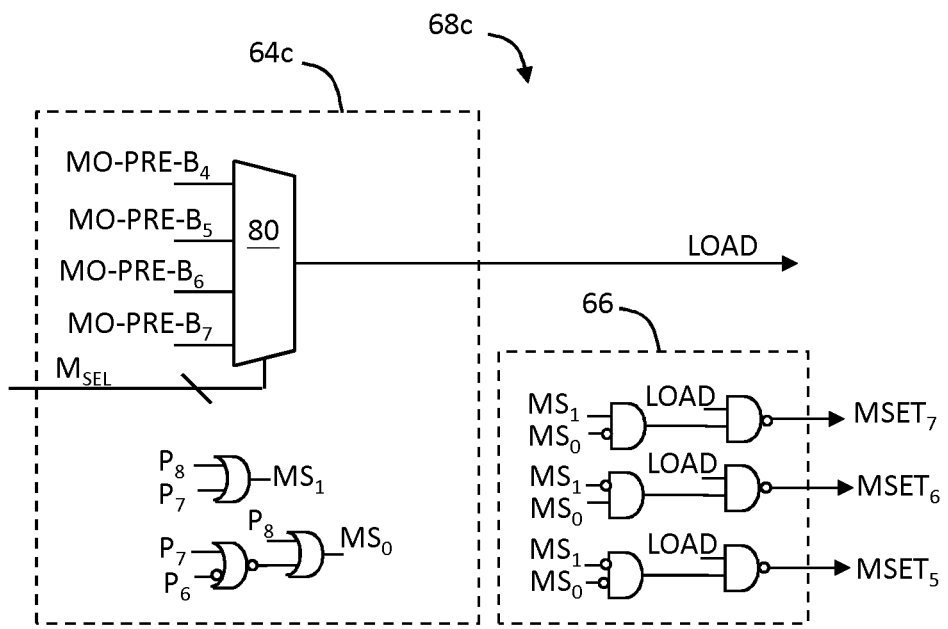

FIG. 11B shows a schematic diagram of another modulus controller 68c. Operations associated with the modulus controller 68c can be deduced from associated descriptions and shall not be further described for brevity.

In the embodiment in FIG. 6, the download signal LOAD may be connected to different modulus output signals along with different divisors. In another embodiment, the download signal LOAD is a same modulus output signal, e.g., the reverse of the modulus output signal $MO_4$.

In the embodiments above, the eight dividers $CS_0$ to $CS_7$ are utilized for illustrative purposes. However, it is appreciated by a person skilled in the related art that any number of dividers may be utilized based on the description of the embodiments, as all extended modification made are encompassed by the scope of the present invention.

In the embodiments of the present invention, a divided-by-2 loop in the first skipped divider is maintained at an open state. Therefore, it is ensured that the first skipped divider is nevertheless capable of accurately performing frequency dividing in the event that it is no longer a skipped divider in subsequent division periods.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A multiple-modulus divider, comprising:
   a divisor loader, for downloading a divisor when a download signal indicates a start of a divisor period;
   a multiple-modulus dividing circuit, comprising a plurality of cascaded dividers, for providing an output frequency according to an input frequency and the divisor, with each divider respectively outputting a plurality of modulus output signals and operating under either a close-loop state or an open-loop state; and
   a modulus controller, for selectively controlling one of the dividers to maintain the open-loop state before the divisor period ends;
   wherein, the download signal is generated according to the modulus output signals.

2. The multiple-modulus divider according to claim 1, wherein the divisor loader downloads the divisor at a first switching edge of the download signal, and the modulus controller controls the selected divider at a second switching edge of the download signal.

3. The multiple-modulus divider according to claim 1, wherein the divisor is operable to cause a first number of dividers to perform frequency dividing to generate the output frequency, and the download signal is outputted by a last divider of the first number of dividers.

4. The multiple-modulus divider according to claim 3, wherein the last divider comprises a D latch for outputting one of the modulus signals, and the modulus controller and the download signal are capable of controlling a D input of the D latch.

5. The multiple-modulus divider according to claim 3, wherein the selected divider is a next divider of the first number dividers.

6. The multiple-modulus divider according to claim 1, wherein the selected divider comprises a D latch for outputting one of the modulus signals, and the modulus controller controls a D input of the D latch.

7. The multiple-modulus divider according to claim 1, a first divider divides a frequency by two when the divider operates under the close-loop state.

8. A control method of modulus frequency dividing for a multiple-modulus dividing circuit, the multiple-modulus dividing circuit comprising a plurality of cascaded dividers and outputting an output frequency according to an input frequency and a divisor, each divider being operable under either a close-loop state or an open-loop state, the method comprising:
   providing a download signal for indicating a division period;
   loading the divisor in response to the download signal;
   selecting one of the dividers as a selected divider according to the divisor; and
   enabling the selected divider to operate under the open-loop state during the division period in response to the download signal.

9. The control method according to claim 8, further comprising:
   a first number of dividers of the dividers performing frequency dividing according to the divisor to generate the output frequency;
   wherein, the download signal is provided by a last divider of the first number of dividers.

10. The control method according to claim 9, wherein the selected divider is a next divider of the first number dividers.

11. The control method according to claim 9, the last divider of the first number of dividers comprising a D latch, the D latch comprising a D input and outputting a modulus signal, the method further comprising:
   providing the download signal according to the modulus signal.

12. The control method according to claim 9, the last divider of the first number of dividers comprising a D latch, the D latch comprising a D input and outputting a modulus signal, the method further comprising:
   controlling the D input according to the download signal.

13. The control method according to claim 8, the last divider of the first number of dividers comprising a D latch, the D latch comprising a D input and outputting a modulus signal, wherein the control step controls the D input.

\* \* \* \* \*